United States Patent [19]

Miyatake et al.

[11] Patent Number: 4,896,297
[45] Date of Patent: Jan. 23, 1990

[54] CIRCUIT FOR GENERATING A BOOSTED SIGNAL FOR A WORD LINE

[75] Inventors: Hideshi Miyatake; Kazuyasu Fujishima; Masaki Kumanoya; Hideto Hidaka; Katsumi Dosaka; Yasuhiro Konishi, all of Hyogo, Japan

[73] Assignee: Mitsubishi Denki Kabushiki Kaisha, Tokyo, Japan

[21] Appl. No.: 112,034

[22] Filed: Oct. 23, 1987

[51] Int. Cl.[4] .................. G11C 7/00; H03K 17/687
[52] U.S. Cl. .................. 365/189.11; 365/204; 365/203; 365/230.06; 307/578
[58] Field of Search .............. 365/230, 189, 204, 226, 365/228, 203, 189.11, 230.06; 307/482, 578

[56] References Cited

U.S. PATENT DOCUMENTS 4,678,941 7/1987 Chao et al. .................. 365/230

FOREIGN PATENT DOCUMENTS 0018080 1/1982 Japan .
0038996 3/1984 Japan .
0227214 10/1987 Japan .................. 365/204

OTHER PUBLICATIONS

IEEE Jour. of Sol. State Cir.: "Fully Boosted 64K Dynamic RAM with Automatic and Self-Refresh", by M. Taniguchi et al., vol. SC-16, No. 5, Oct. 1981, pp. 492–498.

Primary Examiner—Glenn A. Gossage
Attorney, Agent, or Firm—Lowe, Price, LeBlanc, Becker & Shur

[57] ABSTRACT

A circuit for generating a boosted signal for a word line, coupled to a word line driving signal line for transmitting a voltage signal to the word line, coupled to a first power supply, and coupled to a second power supply for providing a voltage higher than the voltage of the first power supply, can supply a compensating voltage for the word line from the second power supply through the word line driving signal line when a voltage of the word line is decreased.

21 Claims, 8 Drawing Sheets

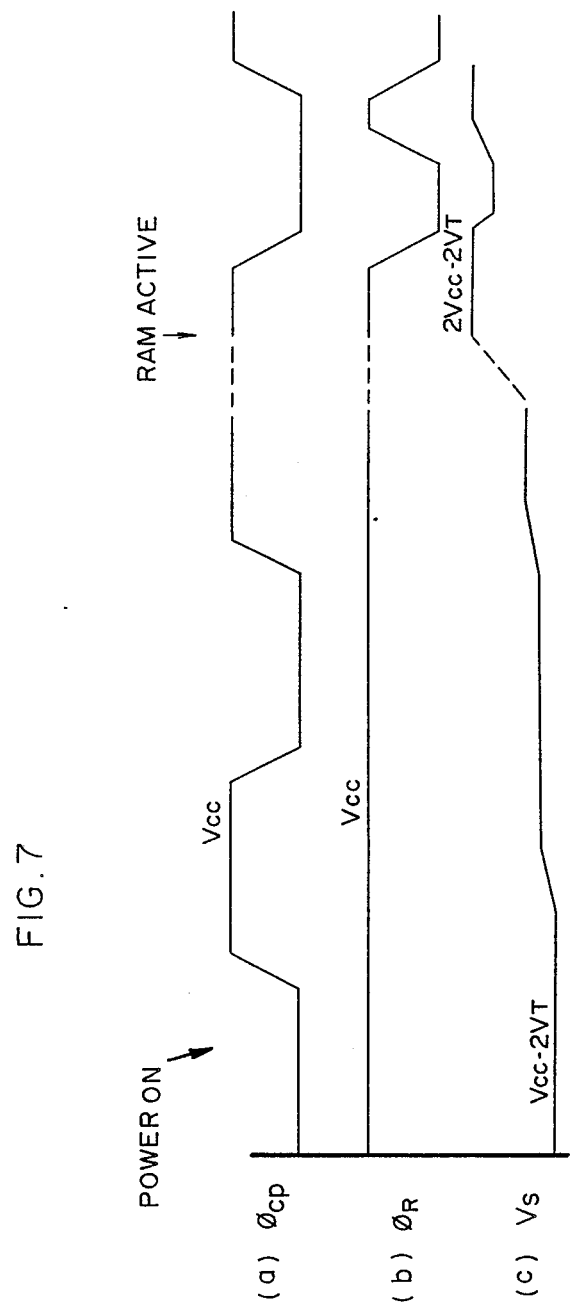

CIRCUIT FOR GENERATING A BOOSTED SIGNAL FOR A WORD LINE

BACKGROUND OF THE INVENTION

1. Field of the Invention

The present invention relates to a circuit for generating a boosted signal for a word line and, more particularly, to a circuit for generating a boosted signal for a word line used as a peripheral circuit of a dynamic random access memory (RAM).

2. Description of the Prior Art

FIG. 1 is a block diagram showing a portion of a peripheral circuit of a conventional dynamic RAM, i.e. a peripheral circuit portion for operating a circuit for generating a boosted signal for a word line, including a circuit for generating a control signal for controlling the peripheral circuit portion.

The peripheral circuit shown in FIG. 1 comprises: a central processing unit (CPU) 58; a precharge start signal generating circuit 51 for generating a precharge start signal $\phi R$ in synchronization with an external $\overline{RAS}$ signal outputted from the CPU 58; a boosting trigger signal generating circuit 52 for generating a boosting trigger signal $\phi T$ to urge a start of boosting after a certain delay upon receipt of the precharge start signal $\phi R$; a boosted signal generating circuit 55 for providing a word line driving signal $\phi W$, serving as a voltage signal boosted for application to a word line, to a decoder circuit 56 through a word line driving signal line; a floating signal generating circuit 53 for receiving the word line driving signal $\phi W$ and the precharge start signal $\phi R$ before boosting, for generating a floating signal $\phi F$ to place a word line in an electrically floating state after a certain delay and for providing the same to the boosted signal generating circuit 55; a boost signal generating circuit 54 for receiving the floating signal $\phi F$ and the precharge start signal $\phi R$, for generating a boost signal $\phi P$ for boosting a word line electrically after a certain delay and for providing the same to the boosted signal generating circuit 55; a decoder circuit 56 for performing decoding operation of signals; and a memory cell array 57 coupled to the decoder circuit 56. A control signal generating circuit 59 comprises the precharge start signal generating circuit 51, the boosting trigger signal generating circuit 52, the floating signal generating circuit 53, the boost signal generating circuit 54 and the boosted signal generating circuit 55.

The boosted signal generating circuit 55 receives the boosting trigger signal $\phi T$, the precharge start signal $\phi R$, the boost signal $\phi P$ and the floating signal $\phi F$ and provides a boosted word line driving signal $\phi W$ to a word line driving signal line coupled to an output. The word line driving signal line is connected to the word line via the decoder circuit 56 and the word line driving signal $\phi W$ is provided to the memory cell array 57.

As shown in M. Taniguchi et al., "Fully Boosted 64K Dynamic RAM with Automatic and Self-Refresh", IEEE Journal of Solid-State circuits, vol. SC-16, No.5, Oct. 1981, pp. 492 –498, a dynamic RAM uses a boosted word line boosted to a voltage higher than a supply voltage to ensure a wide operational margin.

FIG. 2 shows an example of a conventional boosted signal generating circuit. This conventional circuit comprises: MOS transistors 1 to 10; capacitances 11 and 12; nodes a, b and c; and a word line driving signal line W. A word line driving signal line control circuit 150 comprises the above-mentioned MOS transistors 1 to 10 and capacitance 11, and charges the signal voltage $\phi W$ of the word line driving signal line W up to a value approximate to a supply voltage. The capacitance 12 constitutes a capacitor circuit for boosting a charging voltage of the word line driving signal line W to a value higher than the supply voltage.

The reference character $\phi R$ denotes a precharge start signal; the reference character $\phi T$ denotes a boosting trigger signal; the reference character $\phi P$ denotes a boost signal; the reference character $\phi F$ denotes a floating signal outputted before boosting.

Referring now to a waveform diagram in FIG. 3, an operational principle of the conventional circuit is described. A dynamic RAM is brought in the so-called precharge period when the precharge signal $\phi R$ is at high level, the word line driving signal $\phi W$ is at low level, the nodes b and c are at low level and the node a is at high level.

After completion of a precharge, the transistor 3 becomes an on-state when the trigger signal $\phi T$ attains the high level, whereby the node c is charged. Thus, the transistor 4 becomes an on-state, a potential of the node b is kept at approximately the ground level because the transistor 6 is also in an on-state and an on resistance of the transistor 4 is set to be more than five times as large as that of the transistor 6. At the same time, the transistor 5 becomes an on-state and charges a load capacitance of the word line itself and the boost capacitance 12. Thus, the transistor 2 becomes an on-state and the transistor 6 becomes an off-state after the potential of the node a is brought to low level. At that time, the node b is charged through the transistor 4, the potential of the node c is boosted to be higher than the supply voltage $V_{cc}$ through capacitive coupling by means of the capacitance 11 and the word line driving signal line W is charged up to the supply voltage.

In response therefore, the signal $\phi T$ becomes low level and the transistors 7 and 8 become an on-state when the signal $\phi F$ becomes high level, with the result that potentials of the nodes b and c are brought to low level. As a result, the word line driving signal line W is brought into an electrically floating state.

Thereafter, the boost signal $\phi P$ becomes high level and the word line driving signal line W is boosted to be higher than the supply voltage $V_{cc}$ through capacitive coupling by means of the capacitance 12.

In an usual dynamic RAM, bit lines are charged up to high level and a number of bit lines are discharged at the time of sensing operation. In such case, the potential of the word line is lowered through capacitive coupling by means of the bit line and the word line as shown by a dotted line in FIG. 3 because of electrical floating of the word line as mentioned above.

Therefore, the structure of the conventional boosted signal driving circuit as mentioned above causes a decrease in voltage for writing of the memory cell, with the result that a write operation cannot be performed normally to reduce an operational margin.

SUMMARY OF THE INVENTION

Therefore, it is a major object of the present invention to provide an improved circuit for generating a boosted signal for a word line in a dynamic RAM capable of recovering a level of a word line voltage even if a decrease could occur in the word line voltage through capacitive coupling between the bit line and word line at the time of sensing operation.

A preferred circuit for generating a boosted signal for a word line in a dynamic RAM in accordance with the present invention comprises: control means coupled to a word line driving signal line for transmitting a voltage signal to a word line and to a first power supply for applying a voltage of a first level and responsive to a precharge start signal and a boosting trigger signal generated from control signal generating means for bringing the word line driving signal line to the voltage of the first level and then responsive to a floating signal generated from the control signal generating means for rendering the word line driving signal line in an electrically floating state; first boost means coupled to the word line driving signal line and responsive to a boost signal generated from the control signal generating means for boosting the word line driving signal line; and compensating voltage supply means coupled to the word line driving signal line and to a second power supply for applying a voltage of a second level for supplying a compensating voltage to the word line driving signal line to compensate for decreasing of a voltage of the word line driving signal line.

Since a circuit for generating a boosted signal for a word line in accordance with the present invention comprises the compensating voltage supply means for supplying a compensating voltage to the word line driving signal line when the voltage level of the word line driving signal line is lowered, a voltage level of a word line can be recovered to prevent a decrease in a voltage for writing of memory cells of a dynamic RAM by supplying the compensating voltage from the compensating voltage supply means to a word line through the word line driving signal line when a voltage level is lowered because of capacitive coupling between a bit line and a word line.

Therefore, according to the present invention, since a compensating voltage is supplied to the word line driving signal line which transmits a voltage signal to a word line by the compensating voltage supply means, advantages are brought about that a voltage decrease in the word line can be compensated, a more accurate write operation into memory cells of a dynamic RAM can be performed and a more reliable dynamic RAM can be provided.

According to a more preferred embodiment of the present invention, compensating voltage supply means comprises first switching means connected between the word line driving signal line and a second power supply, and first switching signal generating means coupled to a control input of the first switching means.

According to a further preferred embodiment of the present invention, first switching signal generating means comprises second boost means responsive to the precharge signal for bringing an output of the first switching signal generating means to the voltage of the word line driving signal line, responsive to the floating signal for rendering the output of the first switching signal generating means in a floating state, and responsive to the boost signal for boosting the output of the first switching signal generating means to a value higher than a voltage of a first level.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram showing another embodiment of a boosted signal generating circuit for a word line in a dynamic RAM in accordance with the present invention.

DESCRIPTION OF THE PREFERRED EMBODIMENTS

Figure 1:
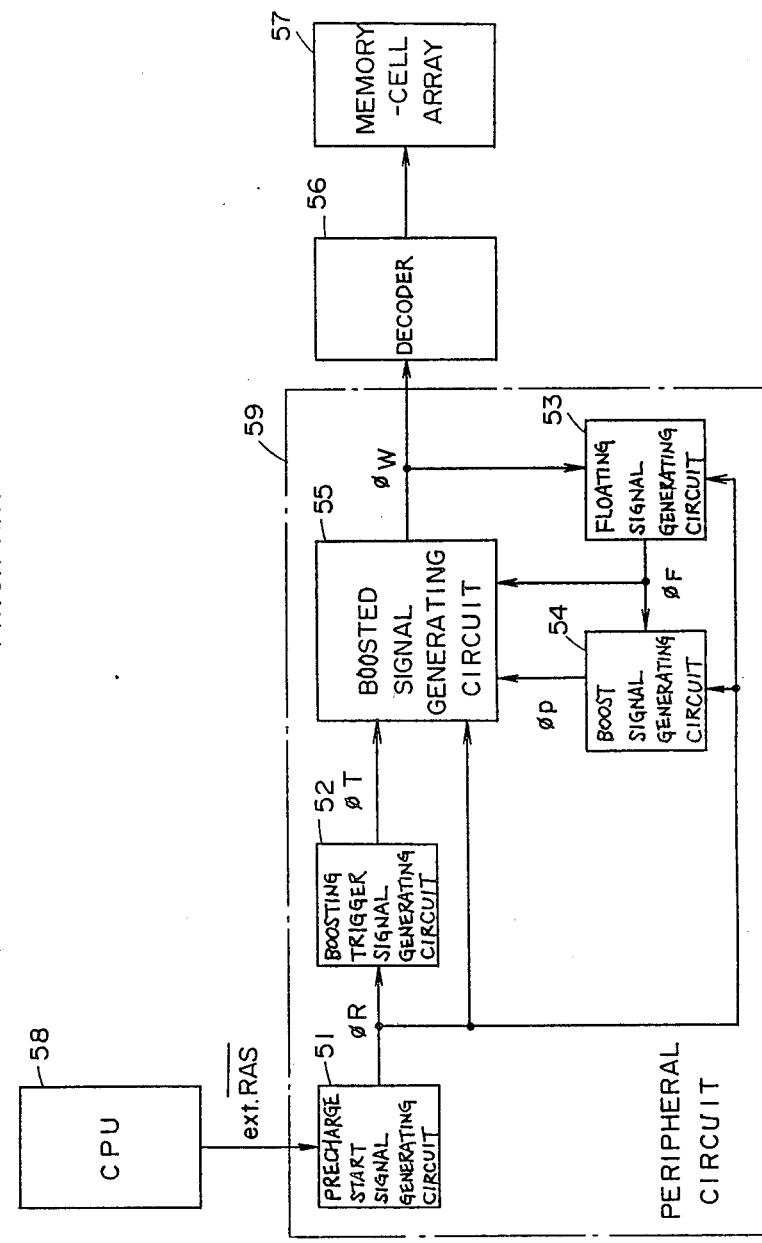
FIG. 1 is a block diagram showing a portion of a peripheral circuit of a conventional dynamic RAM.
Figure 2:
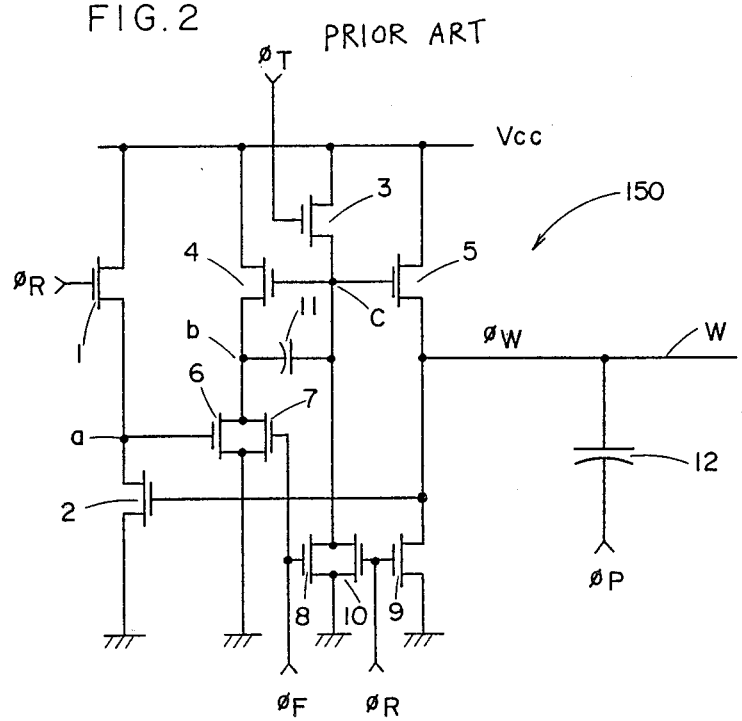
FIG. 2 is a circuit diagram showing a boosted signal generating circuit for a word line of a conventional dynamic RAM.
Figure 4:
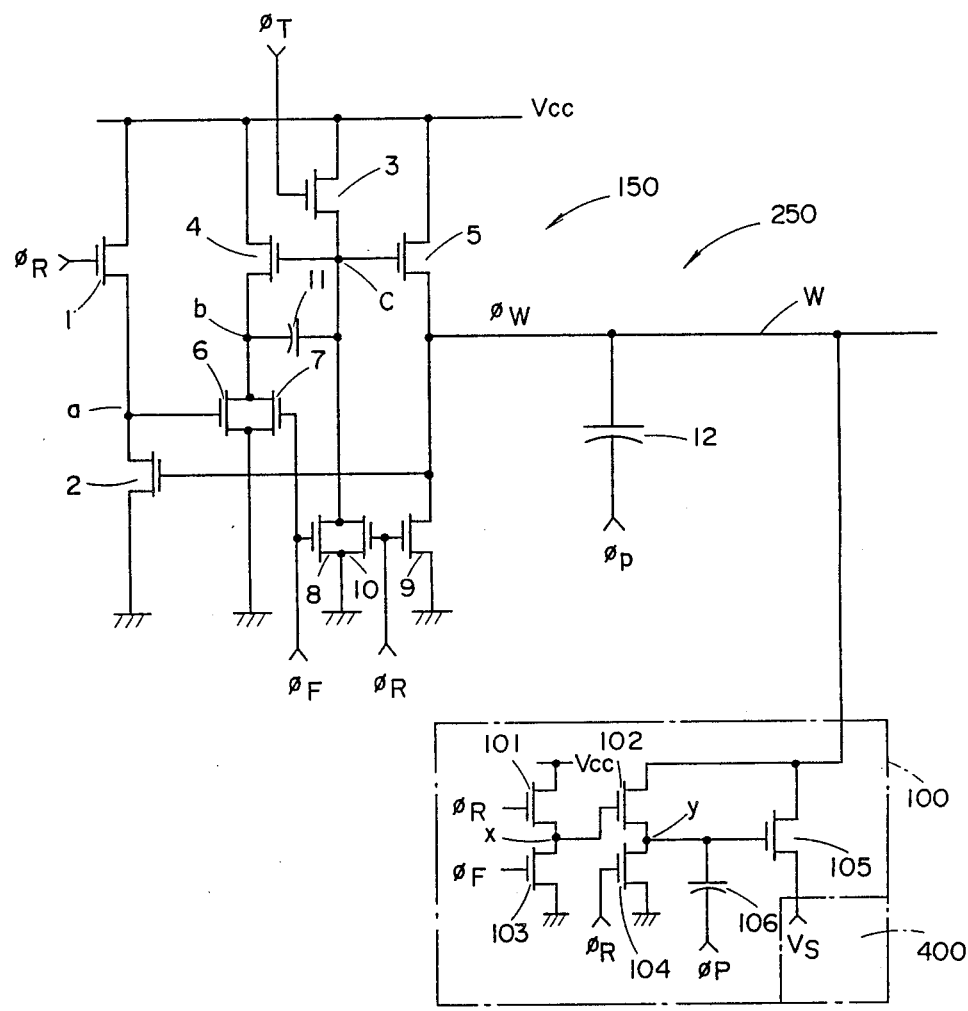
FIG. 4 is a circuit diagram showing one embodiment of a boosted signal generating circuit for a word line of a dynamic RAM in accordance with the present invention.

Referring to the figures, one embodiment of the present invention is described hereinafter. FIG. 4 shows a boosted signal generating circuit in accordance with one embodiment of the present invention. Referring to FIG. 4, the reference numerals 1 to 12 denote the same components as those in FIG. 2, and the circuit in FIG. 4 further comprises: a boosted signal generating circuit 250 comprising a word line driving signal line control circuit 150 and the capacitance 12; and a compensating voltage supply circuit 100 for connecting an internal power supply for generating a voltage signal of a constant level boosted to a voltage higher than that of a word line driving signal $\phi W$, to a driving signal line W simultaneously with or after boosting of the driving signal.

The circuit in FIG. 4 further comprises MOS transistors 101 to 105, a capacitance 106, nodes x and y, and an internal power supply VS boosted up to the above-mentioned constant level. The other reference characters are allotted to the same portions as in FIG. 2.

Figure 5:
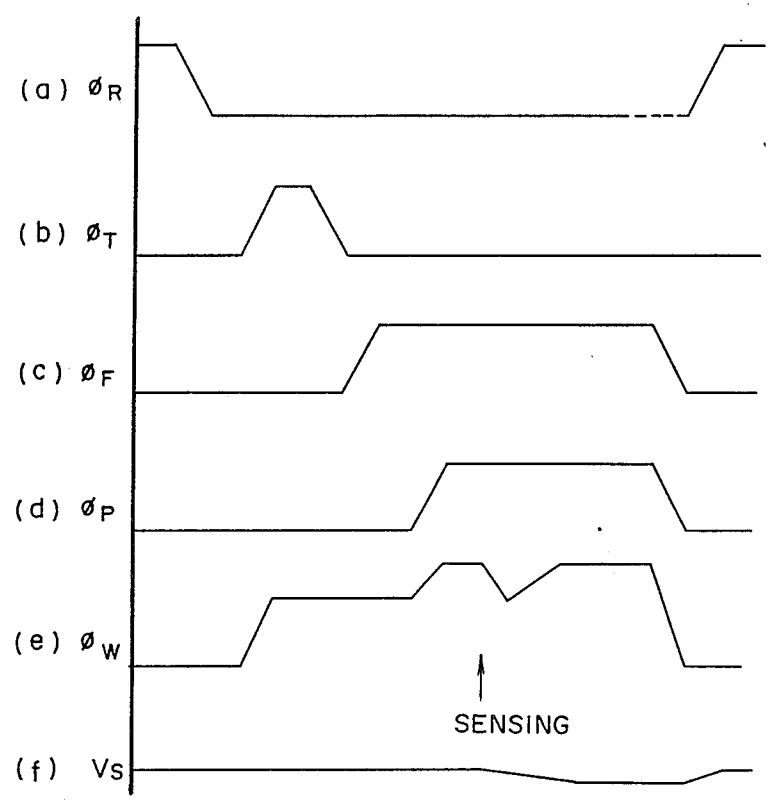
FIG. 5 is a timing chart for depicting an operation of the circuit in FIG. 4.

Now, an operation is described with reference to waveform diagram in FIG. 5. Since portions other than a compensating voltage supply circuit 100 are the same as those in FIG. 2, a description is omitted.

First, the node x is at high level, the node y is at low level and also a word line driving signal $\phi W$ is at low level when the precharge signal $\phi R$ is at high level. Thereafter, when the signal $\phi W$ attains high level of the power supply, the node y becomes high level because the transistor 102 is in an on-state. At that time, although a potential (about 8V) higher than a supply voltage is applied to the internal power supply VS, the voltage of the internal power supply VS is not applied to the signal $\phi W$ because the transistor 105 is in a cut-off state.

Then, when the floating signal $\phi F$ becomes high level, the node x is discharged through the transistor 103 and the transistor 102 is brought to an off-state. Thereafter, the signal φP becomes high level, the node y is boosted to be higher than the supply voltage (8V, for example) by capacitive coupling. At the same time, the word line driving signal φW is also boosted to be higher than the supply voltage (usually 7V). Then, although a high-level outflow of voltage from the internal power supply VS to the signal φW occurs, there is little overflow in effect because a voltage between the source and the gate of the transistor 105 is in the vicinity of a threshold voltage VT (about 1V).

Then, when a word line potential is lowered through capacitive coupling with a bit line after sensing operation, the signal φW is charged again up to the level higher than the supply voltage through the transistor 105. In such case, there is almost no level decrease of the internal power supply VS because capacitance of the internal power supply VS is set to be several times larger than load capacitance of a word line. Also, the level of the internal power supply VS is always kept higher than the level of a related word line, because the high level of the internal power supply VS is applied at every cycle as will be described below.

Figure 6:
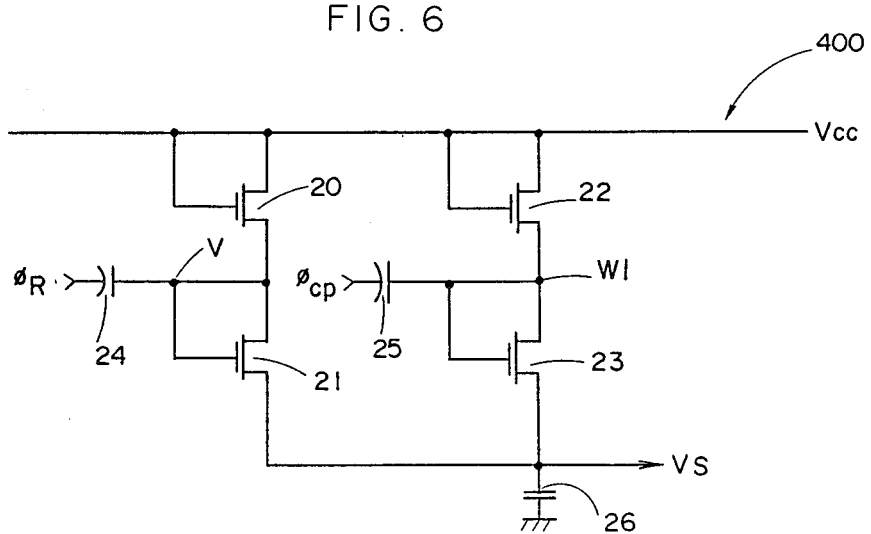
FIG. 6 is a circuit diagram showing an example of an internal power supply generating circuit used in a boosted signal generating circuit for a word line in a dynamic RAM in accordance with the present invention.
Figure 3:
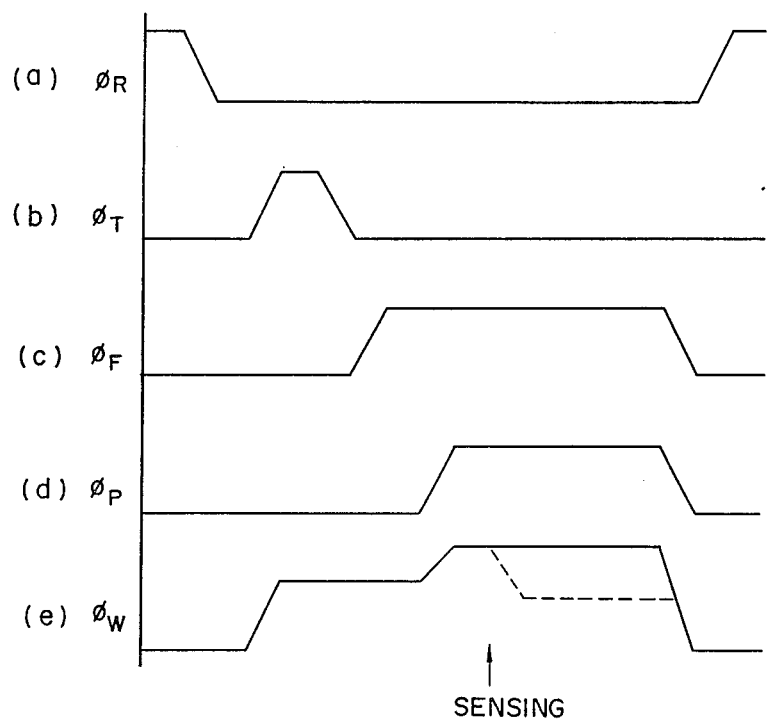
FIG. 3 is a timing chart for depicting an operation of the circuit in FIG. 2.

FIG. 6 shows an example of a circuit for generating an internal power supply (referred to as VS hereinafter). This circuit comprises MOS transistors 20 to 23, capacitances 24 and 25, and a capacitance 26 the size of which is several times larger than a board capacitance of the word line driving signal line φW. The reference character φR denotes a precharge signal, and the reference character φCP denotes a signal asynchronous with the precharge signal. Also reference characters V and W1 denote nodes.

An operational principle of FIG. 6 is described with reference to a waveform diagram in FIG. 7. The signal φCP is an asynchronous signal which occurs immediately after turning on of a power supply of a dynamic RAM. After turning on of the power supply, the node W is at a level $V_{cc} - V_t$ and the internal power supply VS is at a level $V_{cc} - 2V_t$ ($V_{cc}$ being the supply voltage) because the transistors 22 and 23 are in an on-state. When the signal φCP becomes the high level, an electric charge of the capacitance $25 \times V_{cc}$ flows in the internal power supply VS because the transistor 23 becomes an on-state although a potential of the node W tends to be $2V_{cc} - V_t$ through capacitive coupling by means of the capacitance 25, with the result that the potential of the node W becomes $V_{cc} - V_t$.

On the other hand, when the signal φCP becomes low level, the potential of the node W1 tends to be $-V_t$ through capacitive coupling. However, since the transistor 22 becomes an on-state, it is charged again from the power supply $V_{cc}$ to the level $V_{cc} - V_t$. The degree of increase in the level of the internal power supply VS during one cycle of the signal φCP is determined by the ratio of the capacitance 25 and a floating capacitance 26 of the internal power supply VS, and as little as it is in the case of a dynamic RAM, usually there is a set-up time from turning on of the power supply so that the level of the VS can be raised up to $2V_{cc} - 2V_t$ (about 8V) during that period. In addition, the VS generating circuit comprises a circuit including the transistors 20 and 21, and the capacitance 24 and is adapted such that compensation is made of a decreased amount of the level of the internal power supply VS at every cycle of the RAM in accordance with the same operational principle.

Although one embodiment of the present invention has been described above, another embodiment is now described hereinafter.

Figure 8:
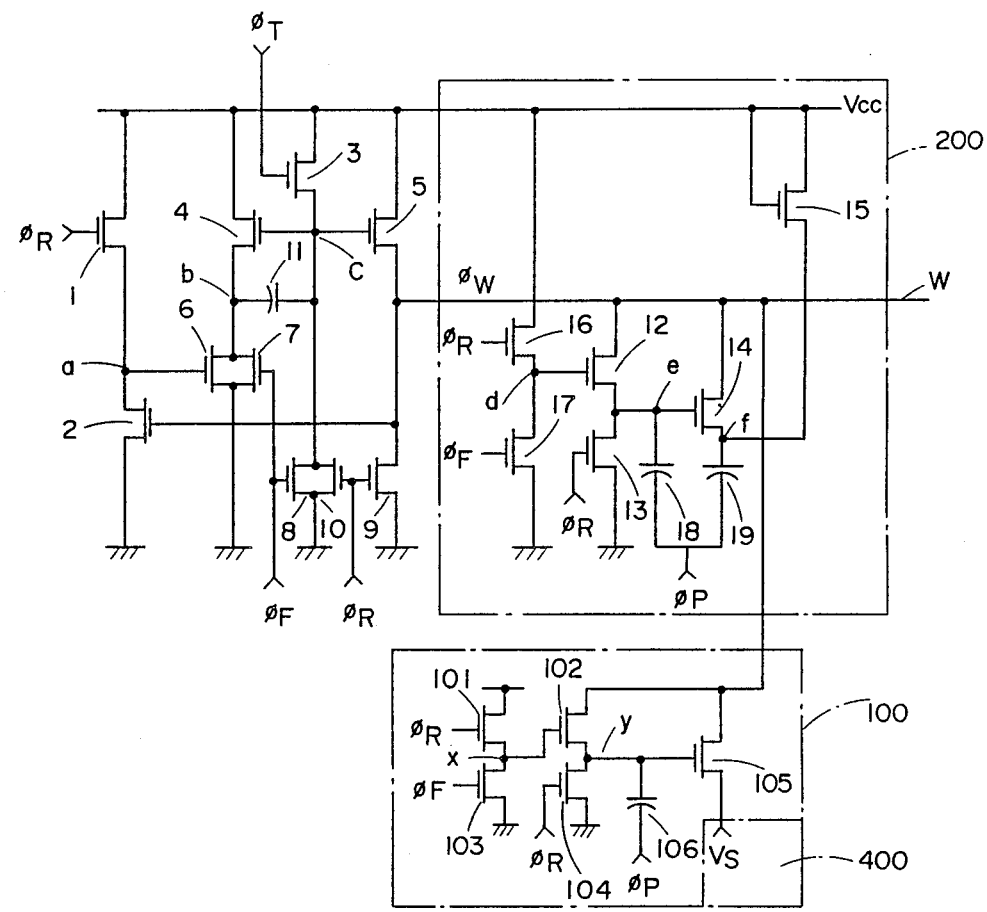
FIGS. 8 and 9 are circuit diagrams showing still further embodiments of a boosted signal generating circuit for a word line in a dynamic RAM in accordance with the present invention.

FIG. 8 shows another embodiment of the present invention. This embodiment comprises a circuit 200 called a switched capacitor circuit which boosts the word line driving signal line W to be higher than the supply voltage $V_{cc}$ as in the capacitance 12 in FIG. 4. The circuit 200 comprises MOS transistors 12 to 17, capacitances 18 and 19, and nodes d, e and f. Other reference characters are allotted to the same portions as those in FIG. 4.

When the signal φR is at high level, the node d is at low level and also the word line driving signal φW is at low level. When the word line driving signal φW becomes high level of the power supply level ($V_{cc}$), the node e is charged up to high level through the transistor 12. At that time, although the node f has been charged up to the high level of $V_{cc} - V_t$ through the transistor 15, the transistor 14 is in a cut-off state.

Thereafter, when the signal φF becomes high level, the high level of the node d is discharged and the transistor 12 becomes in an off-state. Thus, when the signal φP becomes high level, the terminals e and f are boosted to a voltage (about 8V) higher than the supply voltage. Since the capacitance 19 is set to be twice as large as a load capacitance of the word line, the high level of the node f is applied to the word line driving signal φW through the transistor 14, with the result that the word line driving signal φW becomes high level (about 7V) above the supply voltage. Other embodiments of the present invention including a switched capacitor circuit of such kind achieve the same effect as that of the above-mentioned embodiment.

Figure 9:
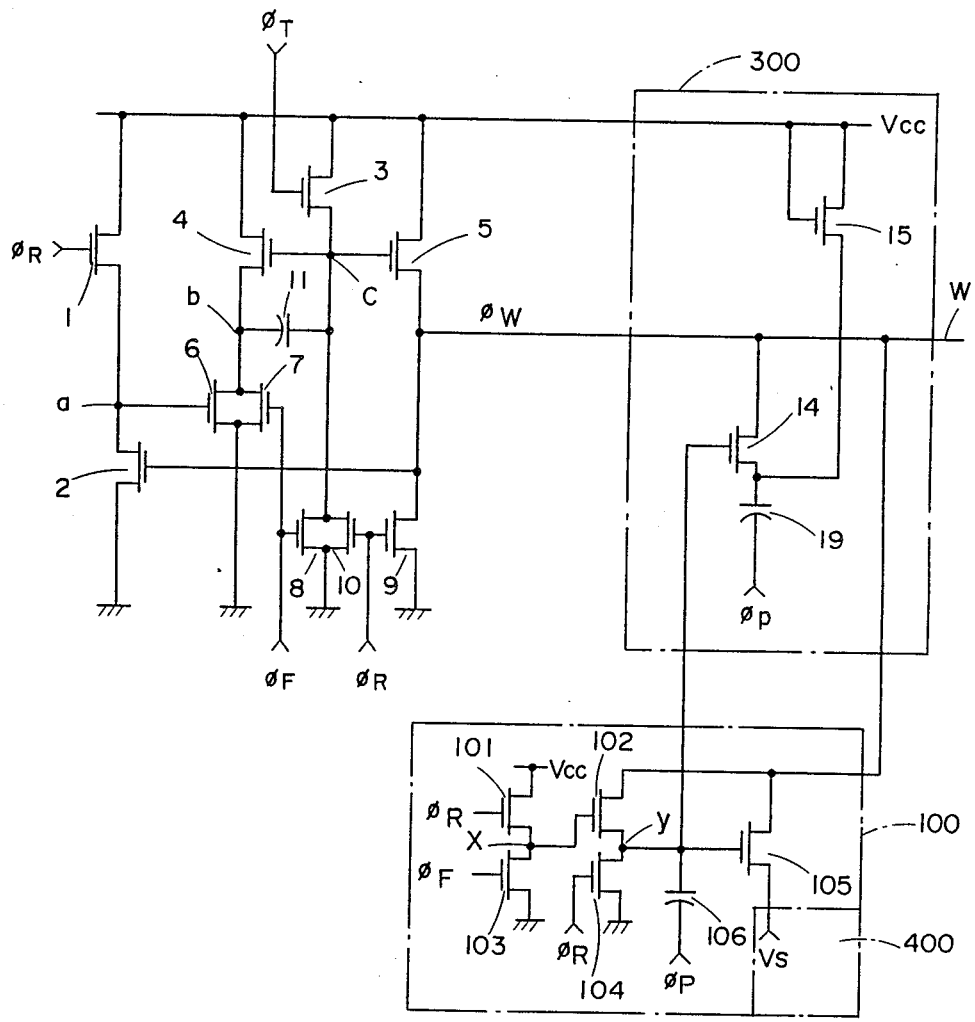

FIG. 9 shows a still further embodiment of the present invention. This embodiment comprises a simplified switched capacitor circuit 300 in which a portion of the switched capacitor circuit 200 in FIG. 8 is simplified because it is adapted to provide a signal from the node y of the circuit 100. The same effect can be obtained using such a simplified switched capacitor circuit. In addition, although connection with the internal power supply VS was made at the same time as boosting of the boost signal φP in the above-mentioned embodiments, the same effect is obtained even after the boost signal, φP becomes the high level if the connection is made within a cycle of the RAM and with timing for writing a supply voltage level into memory cells.

Although the description has been made as to the boosted word line generating circuit of a dynamic RAM hereinbefore, it is needless to say that compensation of a decrease in level can be made also in a boosted signal generating circuit used in other devices.

Since an improved circuit for generating a boosted signal for a word line in a dynamic RAM in accordance with the present invention comprises compensating voltage supply means coupled to the word line driving signal line W to transmit a voltage signal to a word line, for supplying a compensating voltage to compensate for its decrease when the voltage of the word line is decreased, the present invention makes is possible to compensate for decrease in voltage level of a word line, which brings about advantages that writing to memory cells of a dynamic RAM can be performed accurately irrespective of decrease in voltage level of a word line and a dynamic RAM using the inventive circuit has high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit for generating a boosted signal for a word line, comprising:
   control signal generating means responsive to an external synchronous signal for generating a precharge start signal having a predetermined period, a boosting trigger signal delayed from said precharge start signal, a floating signal delayed from said boosting trigger signal and a boost signal delayed from said floating signal;
   a first power supply for applying a voltage of predetermined first level;
   a second power supply for applying a voltage of predetermined second level higher than said first level;
   control means coupled to a word line driving signal line for transmitting a voltage signal to a word line and to said first power supply and responsive to said precharge start signal and said boosting trigger signal for bringing said word line driving signal line to the voltage of the first level and responsive to said floating signal for rendering said word line driving signal line in an electrically floating state;
   first boost means coupled to said word line driving signal line and responsive to said boost signal for boosting said word line and responsive to said boost signal for boosting said word line driving signal line; and
   compensating voltage supply circuit means coupled to said word line driving signal line and to said second power supply and responsive to at least said precharge start signal for supplying a compensating voltage to said word line driving signal line to compensate for decrease in voltage of said word line driving signal line when said decrease occurs.

2. A circuit for generating a boosted signal for a word line in accordance with claim 1, wherein said second power supply comprises precharge circuit means coupled to said first power supply responsive to an asynchronous signal occurring immediately after turning on of a power supply of a dynamic RAM for precharging an output voltage of said second power supply to the second level during a set-up time of said RAM before said RAM becomes active, and voltage supply circuit means responsive to said precharge start signal for compensating for a decreased amount of an output voltage of said second power supply after said RAM becomes active.

3. A circuit for generating a boosted signal for a word line in accordance with claim 2, wherein said precharge circuit means comprises: a series connection of a switching device having a control input coupled to said first power supply and another switching device, provided between outputs of said first power supply and said second power supply, a connection point of said last named two switching devices being a fifth connection point, a control input of said another switching device being coupled to said fifth connection point; fourth capacitance means for providing said asynchronous signal to said fifth connection point; and fifth capacitance means connected between said output of said second power supply and the ground.

4. A circuit for generating a boosted signal for a word line in accordance with claim 2, wherein said voltage supply circuit means comprises a series connection of an additional switching device having a control input coupled to said first power supply and a further additional switching device connected between outputs of said first power supply and said second power supply, a connection point of said additional and further additional switching devices being a sixth connection point, a control input of said further additional switching device being coupled to said sixth connection point; and sixth capacitance means for providing said precharges start signal to said sixth connection point.

5. A circuit for generating a boosted signal for a word line in accordance with claim 1, wherein said compensating voltage supply means comprises first switching means connected between said word line driving signal line and said second power supply and first switching signal generating means coupled to a control input of said first switching means.

6. A circuit for generating a boosted signal for a word line in accordance with claim 5, wherein said first switching signal generating means comprises second boost means responsive to said precharge start signal for bringing an output of said first switching signal generating means to the voltage of said word line driving signal line, responsive to said floating signal for rendering an output of said first switching signal generating means in a floating state and responsive to said boost signal for boosting an output of said first switching signal generating means to a value exceeding the voltage of said first level.

7. A circuit for generating a boosted signal for a word line in accordance with claim 6, wherein said first switching signal generating means comprises: a series connection of a first switching device operating in response to said precharge start signal and a second switching device operating in response to said floating signal, said series connection being provided between said first power supply and the ground, a connection point of said first and second switching devices being a first connection point; and a series connection of a third switching device operating in response to a signal from said first connection point and a fourth switching device operating in response to said precharge start signal, said series connection being provided between said word line driving signal line and the ground, a connection point of said third and fourth switching devices being a second connection point, and said second boost means is coupled to said second connection point and responsive to said boost signal for boosting said second connection point.

8. A circuit for generating a boosted signal for a word line in accordance with claim 5, wherein said first switching means comprises a transistor device responsive to an output signal of said first switching signal generating means and performing a switching operation according to a function of a difference between the voltage of said word line driving signal line and the voltage of said second power supply.

9. A circuit for generating a boosted signal for a word line in accordance with claim 8, wherein said transistor device comprises a field-effect device of a predetermined conductivity type.

10. A circuit for generating a boosted signal for a word line in accordance with claim 9, wherein said field-effect device of the predetermined conductivity type comprises a field-effect device having one electrode coupled to said second power supply, another electrode coupled to said word line driving signal line and a gate coupled to an output of said first switching signal generating means.

11. A circuit for generating a boosted signal for a word line in accordance with claim 10, wherein said field-effect device of the predetermined conductivity type comprises an N-type field-effect device in which said one electrode is a drain and said another electrode is a source.

12. A circuit for generating a boosted signal for a word line in accordance with claim 1, wherein said first boost means comprises first capacitance means coupled to said word line driving signal line for providing said boost signal to said word line driving signal line.

13. A circuit for generating a boosted signal for a word line in accordance with claim 12, wherein said second boost means comprises second capacitance means for providing said boost signal to said second connection point.

14. A circuit for generating a boosted signal for a word line in accordance with claim 12, wherein said first capacitance means comprises switched capacitor circuit means.

15. A circuit for generating a boosted signal for a word line in accordance with claim 14, wherein said switched capacitor circuit means comprises second switching means connected to said word line driving signal line, diode means coupled to said word line driving signal line through said second switching means for receiving the voltage of said first power supply, a capacitor for said first boost means, and second switching signal generating means coupled to a control input of said second switching means.

16. A circuit for generating a boosted signal for a word line in accordance with claim 15, wherein said second switching signal generating means comprises third boost means responsive to said precharge start signal for bringing the control input of said second switching means to the voltage of said word line driving signal line, responsive to said floating signal for rendering the control input of said second switching means in a floating state and responsive to said boost signal for boosting voltage of the control input of said second switching means.

17. A circuit for generating a boosted signal for a word line in accordance with claim 15, wherein said second switching signal generating means comprises: a series connection of a precharge start signal responsive switching device operating in response to said precharge start signal and a floating signal responsive switching device operating in responsive to said floating signal, said series connection being provided between said first power supply and the ground, a connection point of said precharge start signal responsive switching device and said floating signal responsive switching device being a third connection point; and a series connection of an additional switching device operating in response to a signal from said third connection point and a further precharge start signal responsive switching device operating in response to said precharge start signal, said series connection being provided between said word line and said the ground, a connection point of said additional and said further precharge start signal responsive switching device being a fourth connection point, said third boost means being connected to boost said fourth connection point.

18. A circuit for generating a boosted signal for a word line in accordance with claim 17, wherein said third boost means comprises third capacitance means for providing said boost signal to said fourth connection point.

19. A circuit for generating a boosted signal for a word line in accordance with claim 15, wherein said compensating voltage supply means comprises third switching means connected between said word line driving signal line and said second power supply, and third switching signal generating means coupled to a control input of said third switching means, and said second switching signal generating means of said switched capacitor circuit means comprises said third switching signal generating means.

20. A method for driving a circuit for generating a boosted signal for a word line in a memory circuit having word lines and bit lines for addressing memory cells and a circuit for generating a boosted signal to be applied to a selected one of said word lines, comprising the steps of:
generating a control signal responsive to an external synchronous signal for generating a precharge start signal having a predetermined period, a boosting trigger signal delayed from said precharge start signal, a floating signal delayed from said boosting trigger signal and a boost signal delayed from said floating signal; and
controlling a compensating voltage supply circuit means coupled to said word line driving signal line and to said second power supply responsive to at least said precharge start signal for supplying a compensating voltage to said word line driving signal line to compensate for a decrease in voltage of said word line driving signal line when said decrease occurs.

21. An apparatus which includes at least a first power supply for supplying a voltage of predetermined first level, a second power supply for supplying a voltage of predetermined second level higher than said first level and a circuit for generating a boosted signal for a word line, comprising:
control signal generating means responsive to an external synchronous signal for generating a precharge start signal having a predetermined period, a boosting trigger signal delayed from said precharge start signal, a floating signal delayed from said boosting trigger signal and a boost signal delayed from said floating signal;
control means coupled to a word line driving signal line for transmitting a voltage signal to a word line and to said first power supply and responsive to said precharge start signal and said boosting trigger signal for bringing said word line driving signal line to the voltage of the first level and responsive to said floating signal for rendering said word line driving signal line in an electrically floating state;
first boost means coupled to said word line driving signal line and responsive to said boost signal for boosting said word line and responsive to said boost signal for boosting said word line driving signal line; and
compensating voltage supply circuit means coupled to said word line driving signal line and to said second power supply and responsive to at least said precharge start signal for supplying a compensating voltage to said word line driving signal line to compensate for decrease in voltage of said word line driving signal line when said decrease occurs.

* * * * *